United States Patent
Hirano

(10) Patent No.: US 8,223,317 B2
(45) Date of Patent: Jul. 17, 2012

(54) EXPOSURE APPARATUS AND DEVICE MANUFACTURING METHOD CONTROLLING SHUTTER BASED ON INTENSITY OF REFLECTED LIGHT

(75) Inventor: Shinichi Hirano, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 505 days.

(21) Appl. No.: 11/956,597

(22) Filed: Dec. 14, 2007

(65) Prior Publication Data

US 2008/0143990 A1 Jun. 19, 2008

(30) Foreign Application Priority Data

Dec. 15, 2006 (JP) .................... 2006-339204

(51) Int. Cl.
*G03B 27/72* (2006.01)
(52) U.S. Cl. ............................................. 355/71
(58) Field of Classification Search .............. 355/71, 355/68, 53
See application file for complete search history.

(56) References Cited

U.S. PATENT DOCUMENTS

| | | | | |
|---|---|---|---|---|
| 4,780,747 A | * | 10/1988 | Suzuki et al. ............... | 355/68 |
| 5,999,247 A | | 12/1999 | Tezuka | |

FOREIGN PATENT DOCUMENTS

| | | |
|---|---|---|
| JP | A57-071132 | 5/1982 |
| JP | 62-183522 A | 8/1987 |
| JP | 5-13292 A | 1/1993 |
| JP | 05-013292 A | 1/1993 |
| JP | 8-250398 A | 9/1996 |
| KR | 10-0178629 B1 | 5/1999 |

OTHER PUBLICATIONS

Office Action issued in corresponding Korean Patent Application No. 10-2007-0130571 dated Jun. 24, 2009.
Japanese Office Action for corresponding JP 2006-339204, dated Dec. 22, 2011.

* cited by examiner

*Primary Examiner* — Peter B Kim
*Assistant Examiner* — Chia-how Michael Liu
(74) *Attorney, Agent, or Firm* — Rossi, Kimms & McDowell LLP

(57) ABSTRACT

An exposure apparatus for exposing a substrate to radiant energy includes a holder configured to hold the substrate, a shutter for regulating exposure time for the substrate, and a controller configured to control an operation of the shutter. The controller is configured to control the operation of the shutter based on information having a correlation with intensity of light reflected from the holder and the substrate held by the holder.

10 Claims, 10 Drawing Sheets

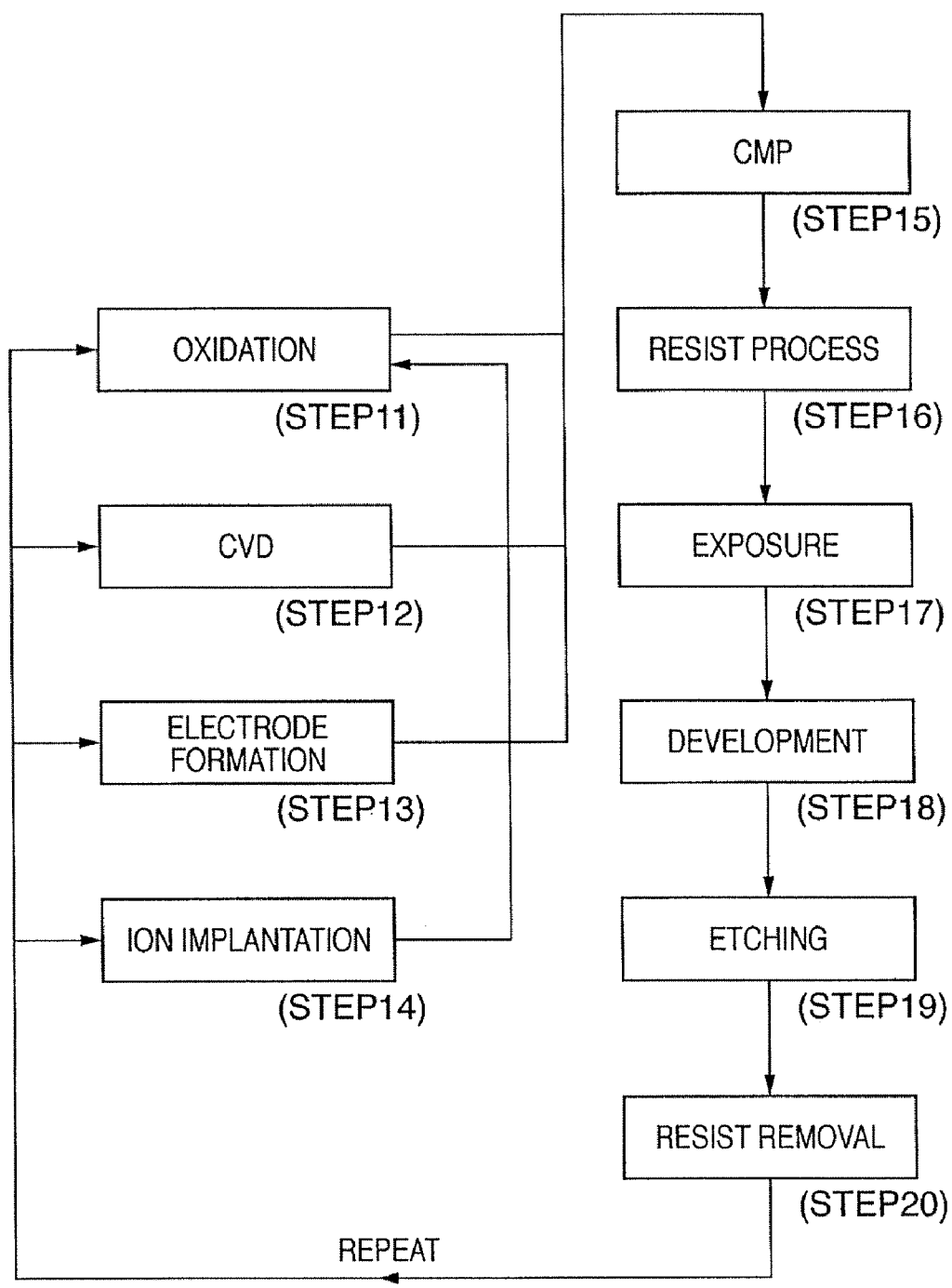

EXPOSURE APPARATUS AND DEVICE MANUFACTURING METHOD CONTROLLING SHUTTER BASED ON INTENSITY OF REFLECTED LIGHT

BACKGROUND OF THE INVENTION

1. Field of the Invention

The present invention relates to an exposure apparatus for exposing a substrate to radiant energy and a method of manufacturing a device by using the exposure apparatus.

2. Description of the Related Art

Japanese Patent Publication No. 61-34252 describes an exposure apparatus which causes a photoelectric detector to detect light from an object to be exposed or the intensity of light that irradiates the object, obtains the output pulse of a frequency corresponding to the detection value, counts the number of pulses, and closes the shutter when the number of pulses has reached a predetermined value. The shutter has light-shielding portions and light-transmitting portions which are alternately provided on a rotating disk. Change between the shielded state and transmission state of illumination light is controlled by driving the shutter. It is necessary to correct an error in dose for irradiation of the object due to the delay time of shutter movement, that is, the time from generation of a shutter close signal to completion of shutter close. For this purpose, the number of pulses which corresponds to the dose during a delay time of the shutter movement is counted when the shutter is driven to the open state. The shutter close signal generation timing is corrected in consideration of the number of pulses.

In exposure control at a low dose, the arrangement described in Japanese Patent Publication No. 61-34252 may delay the shutter close timing. To prevent this, a method of closing the shutter without counting the pulses or a method of counting the pulses, as described above, in a lower light intensity state, and closing the shutter when the number of pulses has reached a predetermined value is employed. To reduce the light intensity, the light source position is moved in the optical-axis direction, or a neutral density filter is inserted between the light source and the object.

However, the method of closing the shutter without counting the pulses requires a technique of guaranteeing exposure of a substrate (wafer) or shot region at an appropriate dose. The present inventors found, through experiments, that the appropriate dose changes when the intensity of light reflected from a substrate held by a holder or the outer portion of the substrate changes. Hence, the dose can be too large or too small in the method of exposing the substrate to radiant energy for a predetermined exposure time.

The intensity of reflected light has a correlation with the area of the shot region on the substrate, the reflectance of the substrate, and the reflectance of the outer portion of the substrate. The area of the shot region on the substrate changes when the shot region falls outside the effective region of the substrate. When a reticle with a plurality of chip region patterns being arrayed is used, the shot regions are sometimes arrayed on the substrate such that some of the plurality of chip regions fall outside the effective region of the substrate. A shot region (to be referred to as a defective shot region) in which at least one chip region falls outside the effective region of the substrate necessarily has a smaller area than a shot region (to be referred to as a full shot region) in which all chip regions fall within the effective region of the substrate. This affects the intensity of light reflected from the substrate in exposure. The reflectance of the substrate can change in accordance with the type of photosensitizer or the layer under it. The reflectance of the outer portion (typically substrate chuck) of the substrate held by the holder depends on the material or coating of the outer portion.

An exposure control method under a lower light intensity enables accurate dose control without the above-described problem of excess or deficient dose, though the throughput is low.

SUMMARY OF THE INVENTION

The present invention has been made in consideration of the above-described background, and has as its exemplary object to implement accurate dose control at a high throughput.

According to the present invention, there is provided an exposure apparatus for exposing a substrate to radiant energy. The apparatus comprises a holder configured to hold the substrate, a shutter for regulating exposure time for the substrate, and a controller configured to control an operation of the shutter, wherein the controller is configured to control the operation of the shutter based on information having a correlation with intensity of light reflected from the holder and the substrate held by the holder.

According to the present invention, it is possible to, for example, realize accurate dose control at a high throughput.

Further features of the present invention will become apparent from the following description of exemplary embodiments with reference to the attached drawings.

BRIEF DESCRIPTION OF THE DRAWINGS

FIG. 10 is a flowchart illustrating a detailed sequence of a wafer process.

DESCRIPTION OF THE EMBODIMENTS

A preferred embodiment of the present invention will be described below with reference to the accompanying drawings.

Figure 1:
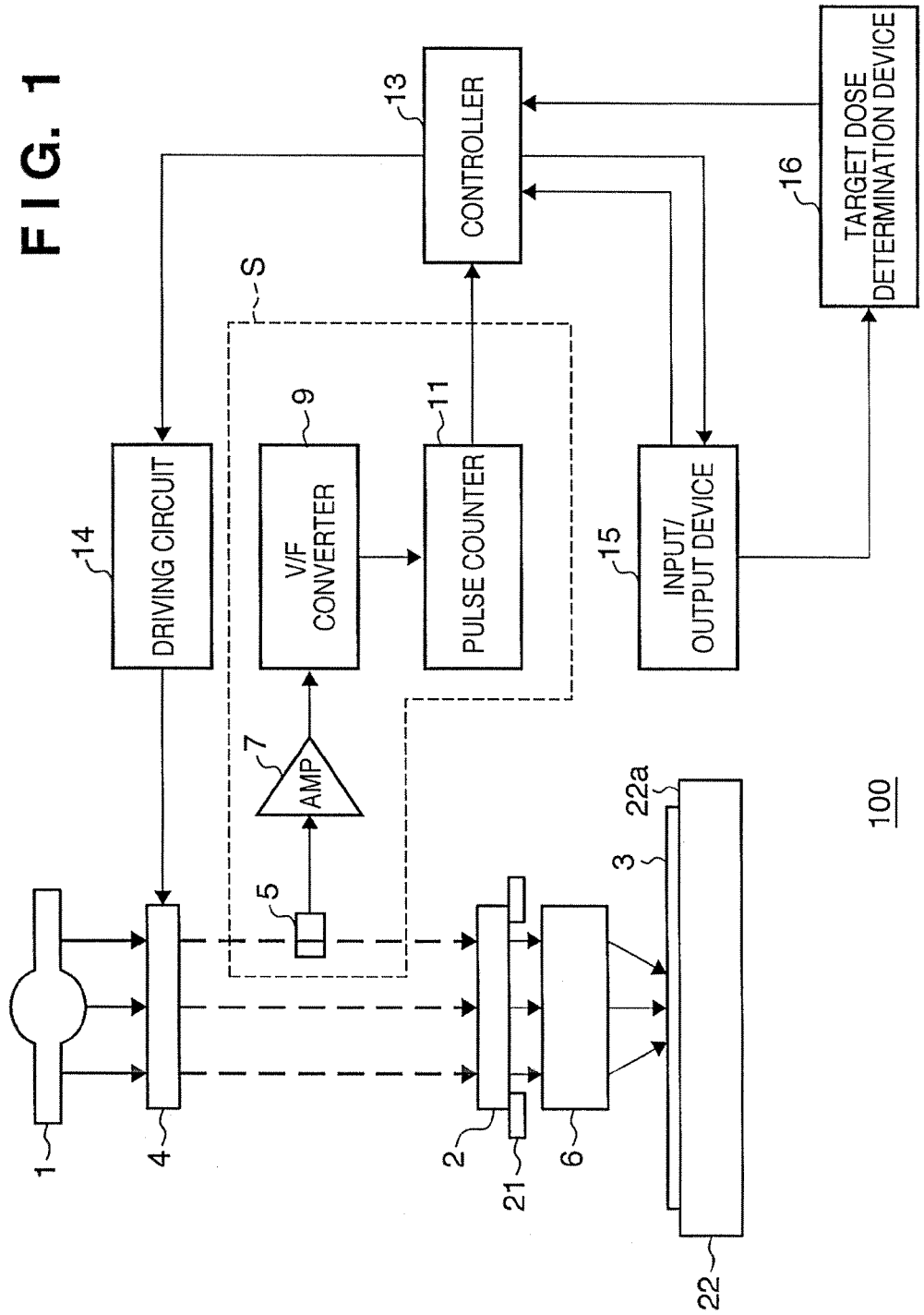
FIG. 1 is a view showing the schematic arrangement of an exposure apparatus according to a preferred embodiment of the present invention.

FIG. 1 is a view showing the schematic arrangement of an exposure apparatus according to a preferred embodiment of the present invention. An exposure apparatus 100 according to the preferred embodiment of the present invention comprises a light source 1, shutter 4, reticle stage 21, projection optical system 6, and holder 22. The holder 22 can include a substrate stage to be driven by a driving mechanism such as a linear motor and a substrate chuck mounted on the substrate stage. The holder 22 holds a substrate (wafer) 3 to which a photoresist (photosensitizer) is applied. In this state, the driving mechanism drives the holder 22 to position the substrate 3. The holder 22 has an outer portion 22a which is located outside the substrate 3 when it is held.

The reticle stage 21 holds and positions a reticle 2. The reticle 2 having a pattern such as a semiconductor circuit pattern is illuminated with illumination light generated by the light source 1. The pattern of the reticle 2 is projected to the substrate 3 through the projection optical system 6 so that a latent image pattern is formed on the photoresist applied to the substrate 3. A developer develops the latent image pattern to form a resist pattern.

The shutter 4 is arranged between the light source 1 and the reticle stage 21. The shutter 4 controls the incident time of illumination light from the light source 1 to the reticle 2, thereby controlling the exposure time of the substrate 3. The exposure apparatus 100 has a dose sensor S for detecting the dose for the substrate 3. The dose sensor S can include, for example, a photosensor 5, amplifier 7, V/F converter 9, and pulse counter 11. The photosensor 5 detects the intensity of illumination light between the shutter 4 and the reticle stage 21. The photosensor 5 includes a light-receiving device. The light-receiving device can be arranged either in the light path of illumination light between the shutter 4 and the reticle stage 21 or to receive light extracted from the light path by a mirror. The amplifier 7 converts a signal representing the light intensity output from the photosensor 5 into a voltage signal. The V/F converter 9 converts the voltage signal output from the amplifier 7 into a pulse train having a frequency corresponding to the voltage signal. The pulse counter 11 counts the number of pulses of the pulse train output from the V/F converter 9. The count value obtained by the pulse counter 11 indicates the sum of the light intensities of illumination light and is therefore proportional to the dose for the substrate. Hence, information representing the dose for the substrate can be obtained by the count value.

The exposure apparatus 100 can also comprise a controller 13, input/output device 15, target dose determination device 16, and shutter driving circuit 14. In a first mode (high dose mode) to be described later, the controller 13 controls the dose based on the output from the pulse counter 11. The shutter driving circuit 14 opens or closes the shutter 4 upon receiving an instruction from the controller 13. The input/output device (console) 15 inputs or outputs various kinds of information. The target dose determination device 16 determines the target dose based on exposure conditions input through the input/output device 15 and other information input as needed.

Figure 2A:
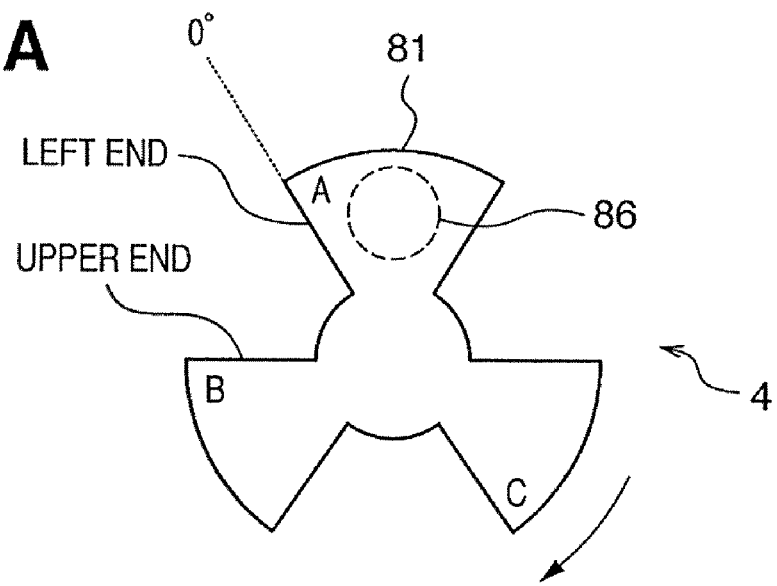
FIGS. 2A to 2C are views for explaining dose control by the operation (open and close) of a shutter.
Figure 2B:
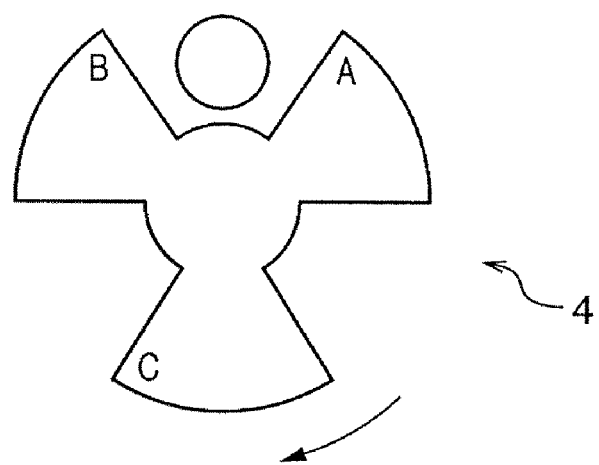
Figure 2C:
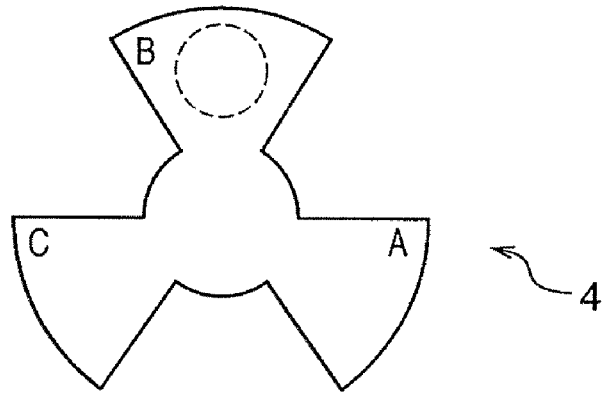

FIGS. 2A to 2C are views for explaining dose control by the operation of the shutter 4. The shutter 4 includes a shutter plate 81. FIGS. 2A to 2C show the positional relationship between the shutter plate 81 and a light path region 86 through which illumination light passes. FIG. 2A shows a state wherein a light-shielding portion A of the shutter plate 81 shields the light path region 86. FIG. 2B shows a state wherein the shutter plate 81 rotates through 60° clockwise from the state in FIG. 2A not to shield the light path region 86. FIG. 2C shows a state wherein the shutter plate 81 further rotates through 60° clockwise from the state in FIG. 2B so that a light-shielding portion B shields the light path region 86. While the light path region 86 is not shielded, the shutter 4 is open. While the light path region 86 is shielded, the shutter 4 is closed.

Figure 3:
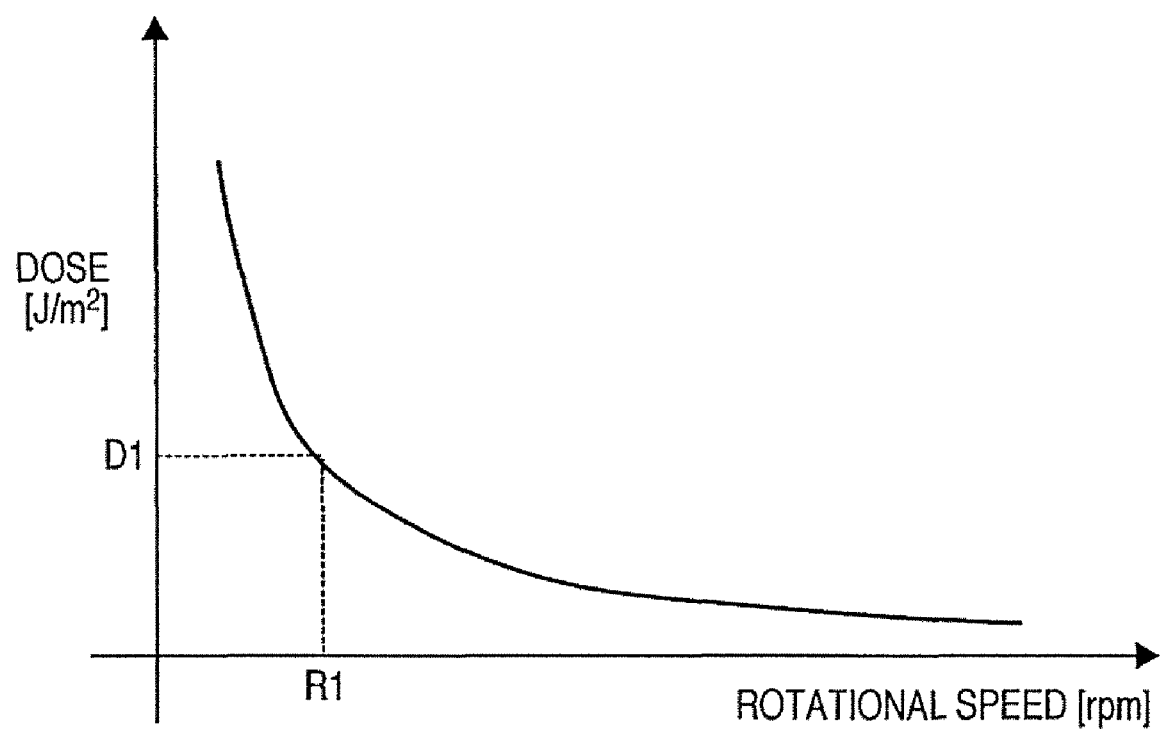
FIG. 3 is a graph showing the relationship between the target dose and the rotational speed of the shutter.

FIG. 3 is a graph showing the relationship between the target dose and the rotational speed of the shutter 4 (rotational speed of the shutter plate 81). The relationship between the target dose and the rotational speed of the shutter 4 shown in FIG. 3 can be obtained by experiments or calculations and stored in a memory (not shown) in the controller 13 as, for example, an approximate function or data table in advance. "Memory" indicates the memory in the controller 13, unless otherwise specified. In place of this memory, a memory serving as an external device outside the controller 13 is also usable, as a matter of course.

Figure 4:
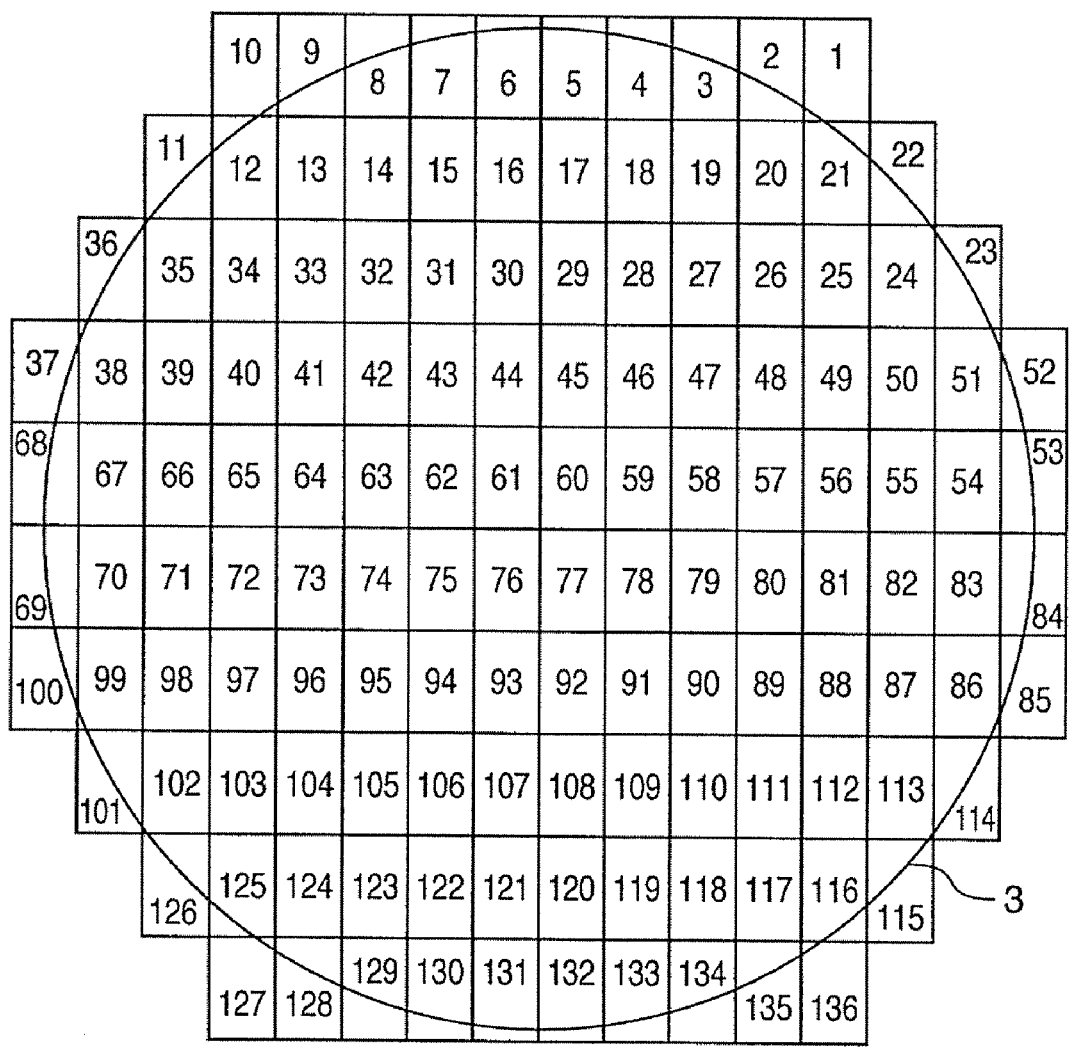
FIG. 4 is a view showing a shot layout on a substrate.

FIG. 4 is a view showing a shot layout on the substrate. Each of the regions arrayed in a matrix on the substrate 3 indicates a divided exposure region called a shot region. A number added to each shot region indicates the order of exposure.

Figure 5:
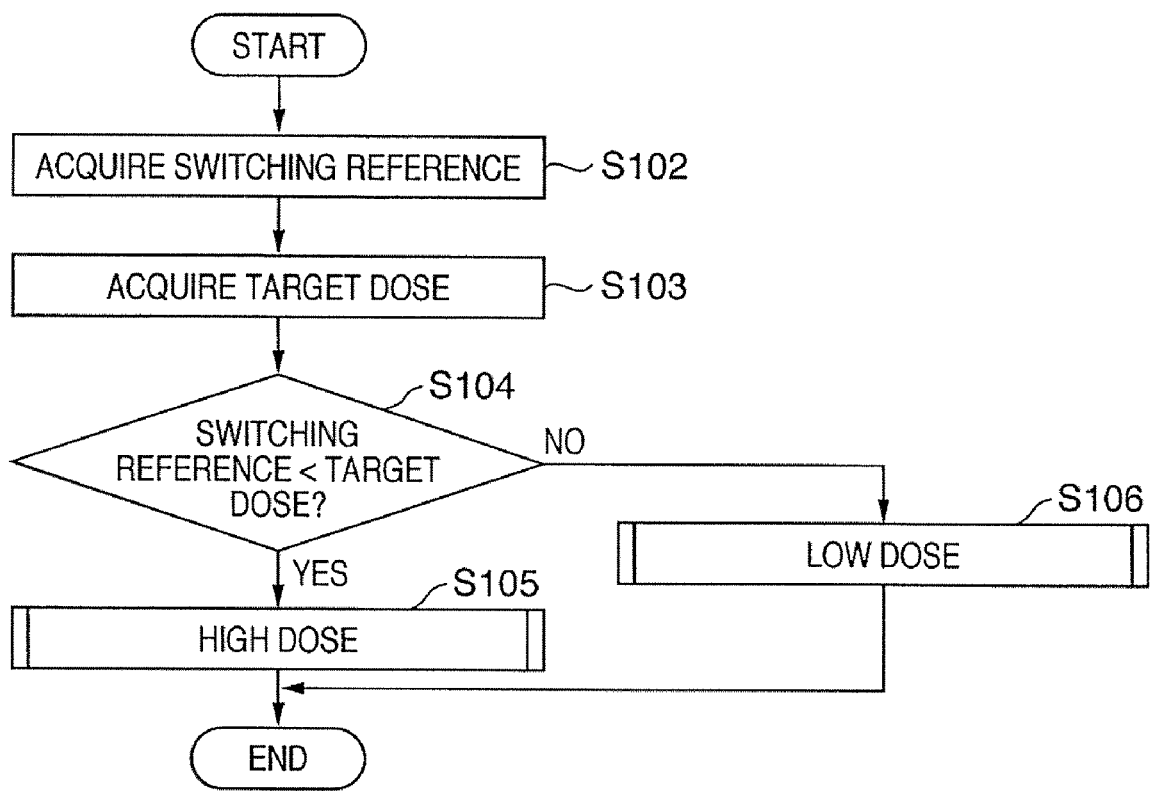
FIG. 5 is a flowchart illustrating a determination process in the exposure apparatus before an exposure sequence.

FIG. 5 is a flowchart illustrating a determination process in the exposure apparatus 100 before an exposure sequence. In step S102, the controller 13 acquires a switching reference input or set through the input/output device 15. In step S103, the controller 13 acquires target dose information (TargetDose) from the target dose determination device 16.

In step S104, the controller 13 compares the switching reference acquired in step S102 with the target dose acquired in step S103. If the target dose is larger than the switching reference, the controller 13 advances the process to step S105 to execute an exposure sequence in the first mode (high dose mode). On the other hand, if the target dose is equal to or smaller than the switching reference, the controller 13 advances the process to step S106 to execute an exposure sequence in the second mode (low dose mode).

Figure 6:
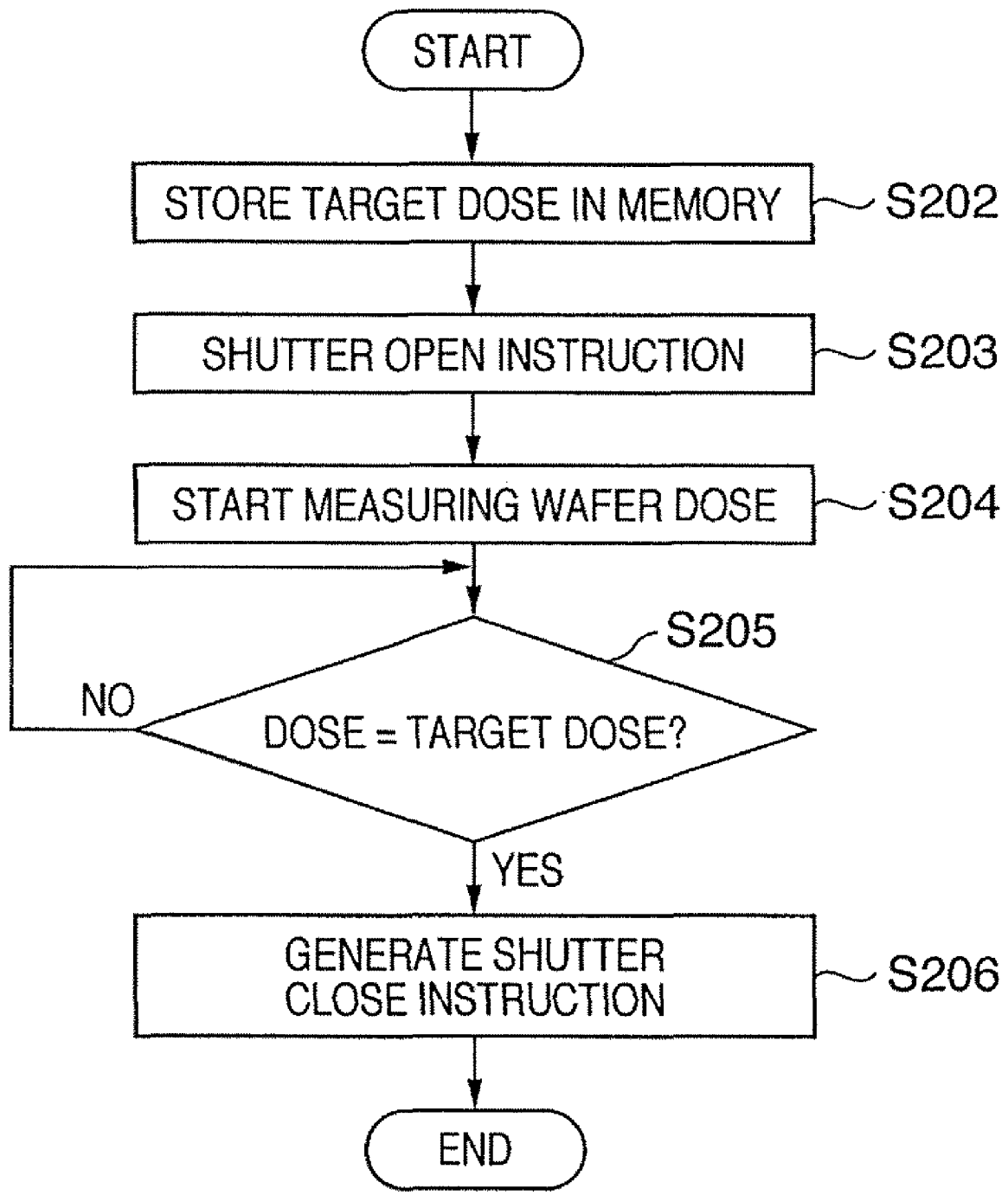
FIG. 6 is a flowchart illustrating an exposure sequence in a first mode (high dose mode)

FIG. 6 is a flowchart illustrating the exposure sequence in the first mode (high dose mode). In step S202, the controller 13 stores, in the memory, the target dose provided by the target dose determination device 16. In step S203, the controller 13 sends a shutter open instruction to the shutter driving circuit 14 to open the shutter 4.

In step S204, the shutter 4 opens, and illumination light generated by the light source 1 illuminates the reticle 2, thereby starting exposing the substrate 3 to radiant energy. The amplifier 7 converts a signal indicating a light intensity output from the photosensor 5 into a voltage signal. The V/F converter 9 converts the voltage signal into a pulse train. The pulse counter 11 counts the number of pulses of the pulse train.

In step S205, the controller 13 reads the count value provided by the pulse counter 11 and determines whether the count value matches the number of pulses determined by the target dose stored in the above-described memory. Step S205 is repeated until the count value provided by the pulse counter 11 matches the number of pulses determined by the target dose. If the count value matches the number of pulses, the controller 13 advances the process to step S206.

In step S206, the controller 13 sends a shutter close instruction to the shutter driving circuit 14 to close the shutter 4.

Figure 7:
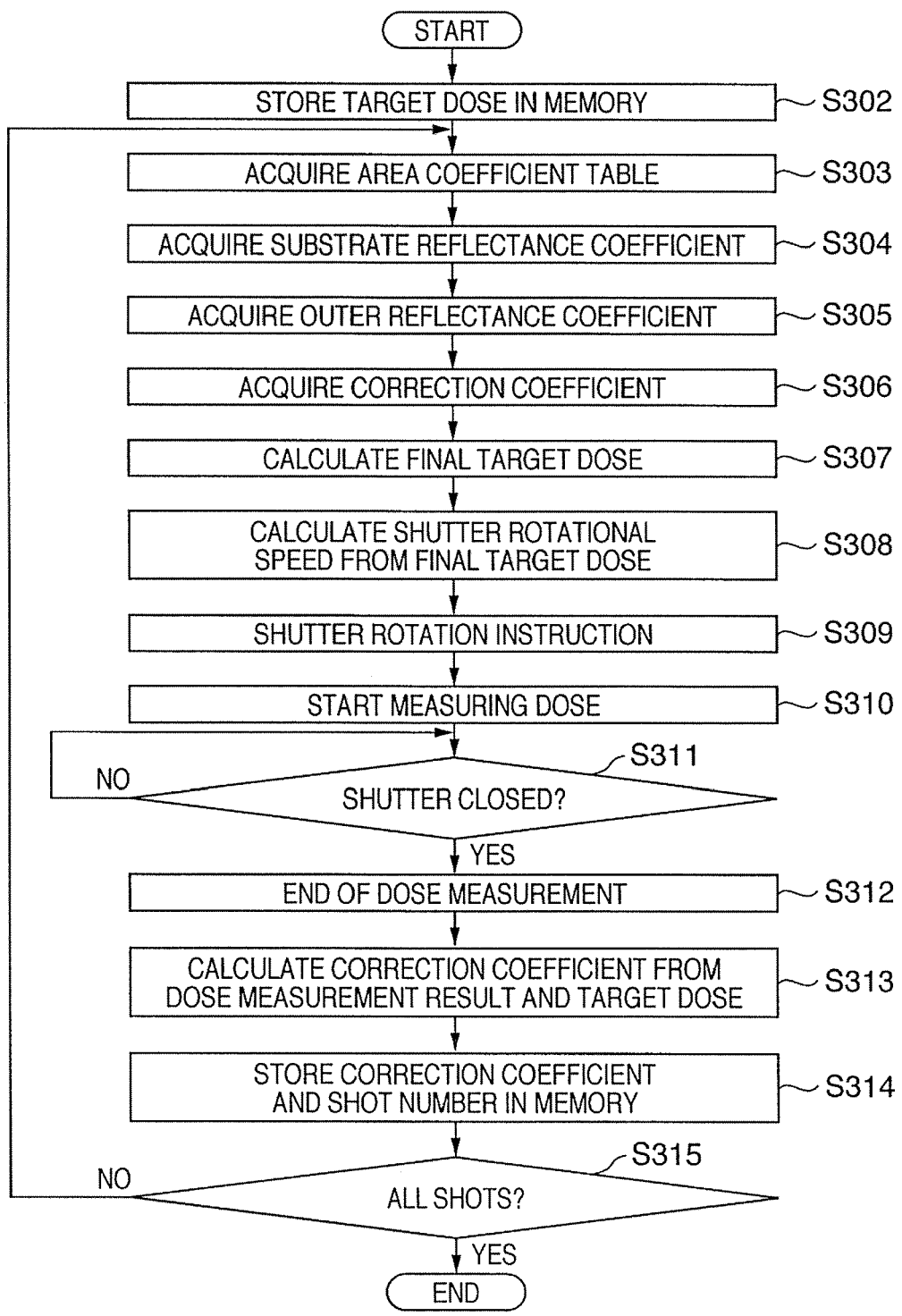
FIG. 7 is a flowchart illustrating an exposure sequence in a second mode (low dose mode)

FIG. 7 is a flowchart illustrating the exposure sequence in the second mode (low dose mode). In step S302, the controller 13 stores, in the memory, a target dose provided by the target dose determination device 16.

In step S303, the controller 13 acquires an area coefficient table (N, AreaRatio) from the input/output device 15. The area coefficient table (N, AreaRatio) represents the relationship between the number (shot number: N) of each shot region and the area coefficient of each shot region on the substrate. The area coefficient is information about the area of a shot region on the substrate. In this example, the area coefficient is expressed as a ratio to the area of a full shot region. More specifically, in this example, the area coefficient of a full shot region is expressed as 1. The area coefficient of a defective shot region is expressed as a value smaller than 1.

In step S304, the controller 13 acquires a substrate reflectance coefficient (WaferRefRatio) from the input/output device 15. The substrate reflectance coefficient is information about a substrate reflectance. The substrate reflectance coefficient changes depending on, for example, the photosensitizer on the substrate surface or the type of layer under the photosensitizer. The substrate reflectance coefficient can be defined as, for example, a ratio to a standard substrate reflectance. The substrate reflectance coefficient has a value common to all shot regions.

In step S305, the controller 13 acquires an outer reflectance coefficient table (N, OuterRefRatio) from the input/output device 15. The outer reflectance coefficient table represents the relationship between the number (shot number: N) of each shot region and the reflectance coefficient of the outer portion. The reflectance coefficient is information about the reflectance of the outer portion of the shot region (in this embodiment, both the effective exposure region of the substrate and the outer portion of the substrate are included). In the example shown in FIG. 4, for example, the shot regions with shot numbers 2, 3, 8, 9, 53, and 84 are defective shot regions. In each defective shot region, the reflectance of the substrate is different from that of the outer portion (holder) 22a of the substrate. Hence, the intensity of light reflected from the substrate and its outer portion and returning to the side of the light source 1 is different from that of a full shot region. The light returning to the side of the light source 1 is reflected again from the optical member on the side of the light source 1 and returns to the substrate side. Hence, the light reflected from the substrate and its outer portion and returning to the side of the light source 1 contributes to an increase in dose for the substrate. Hence, the intensity of light that enters a shot region, that is, defective shot region whose outer portion corresponds to the outer portion of the substrate is different from the intensity of light that enters a full shot region. The outer reflectance coefficient can be defined as, for example, the ratio of the reflectance of the outer portion of the substrate to the reflectance of the substrate. In this case, the outer reflectance for the full shot region is 1.

As described above, in this embodiment, the controller 13 acquires information about the area of each shot region on the substrate, information about the reflectance of the substrate, and information about the reflectance of the outer portion of the substrate. Based on these pieces of information, information having a correlation with the intensity of light reflected from the holder 22 and the substrate held by the holder 22 is obtained.

In step S306, the controller 13 acquires a correction coefficient Coef1(N−1) obtained by exposure of the immediately preceding shot region of the exposure target shot region (i.e., the shot region with the shot number N: Nth shot region). The correction coefficient Coef1(N−1) is correction information obtained by exposure of the immediately preceding shot region. In exposure of the shot region with the first shot number (N=1) of the first substrate in the lot, Coef1(N−1) (=Coef1(0)) can be set to 1. From the second substrate of the lot, Coef1(N−1) can be determined based on, for example, the exposure result of the final shot region of the immediately preceding substrate. Coef1(N−1) to be used in the Nth shot region is determined in step S313 based on the exposure result of the immediately preceding shot region (the shot region with the shot number N−1).

In step S307, the controller 13 calculates the final target dose (FinalDose) based on the information having a correlation with the intensity of light reflected from the holder 22 (outer portion 22a) and the substrate held by the holder 22. More specifically, in this example, the controller 13 calculates the final target dose (FinalDose) based on TargetDose, AreaRatio, WaferRefRatio, OuterRefRatio, and Coef1(N−1) in accordance with $$\text{FinalDose} = \text{TargetDose} \times \text{AreaRatio} \times \text{WaferRefRatio} \times \text{OuterRefRatio} \times \text{Coef1}(N-1) \quad (1)$$

where AreaRatio is the area coefficient of the fourth shot region in the area coefficient table, WaferRefRatio is the substrate reflectance coefficient, OuterRefRatio is the outer reflectance coefficient of the fourth shot region in the outer reflectance coefficient table, and Coef1(N−1) is the correction coefficient obtained by exposure of the immediately preceding shot region.

Depending on the array of shot regions or process, it may be impossible to obtain the appropriate final target dose FinalDose by using the correction coefficient Coef1(N−1) obtained through exposure of a defective shot region. To prevent this, the mode that uses the correction coefficient Coef1(N−1) and the mode that does not use the correction coefficient may be switched. This switching can be set through the input/output device 15.

In the mode that does not use the correction coefficient Coef1(N−1), the final target dose FinalDose is obtained in accordance with, e.g., $$\text{FinalDose} = \text{TargetDose} \times \text{AreaRatio} \times \text{WaferRefRatio} \times \text{OuterRefRatio} \quad (2)$$

Figure 8:
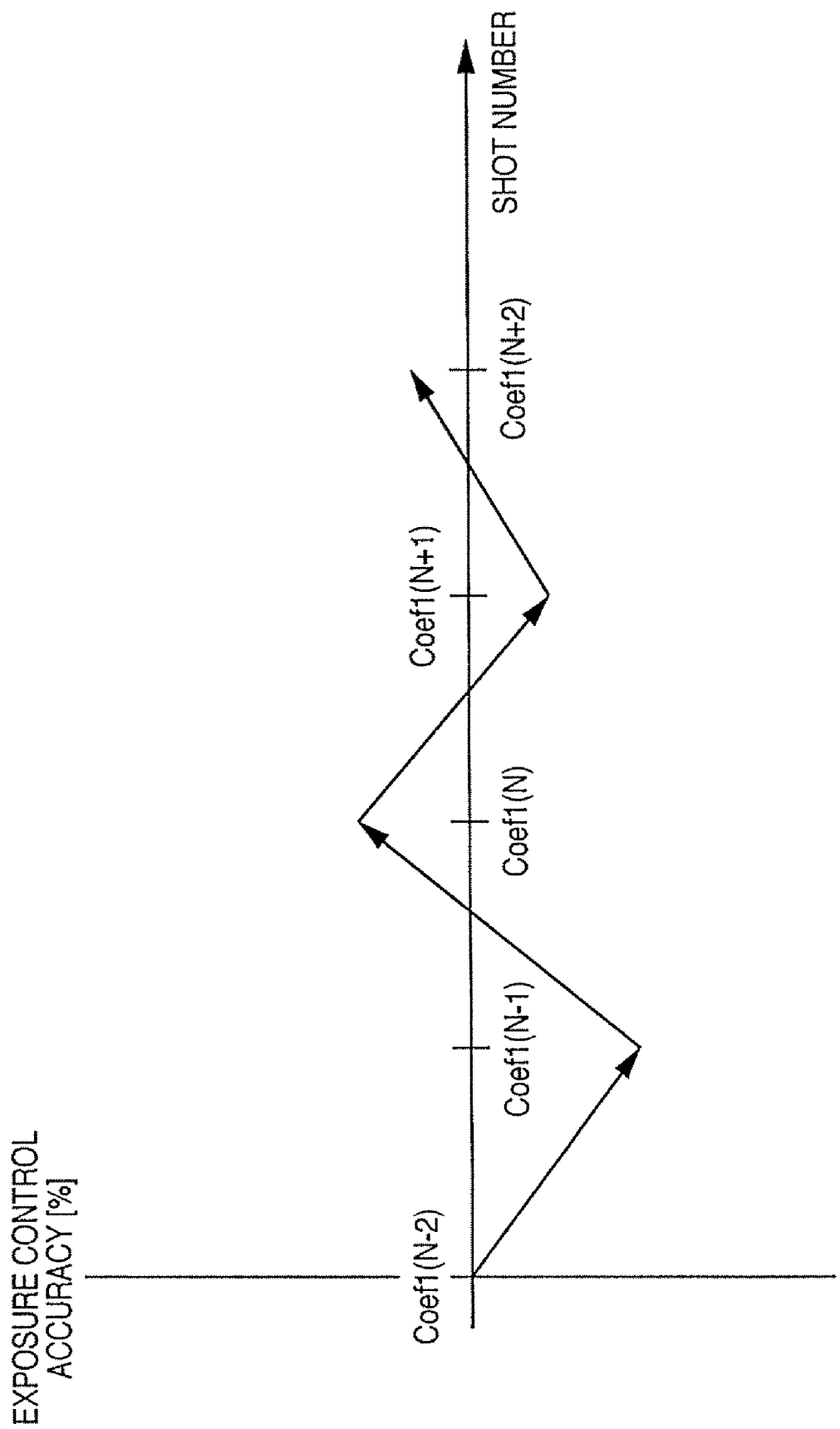
FIG. 8 is a graph showing a case wherein the final target dose cannot be determined accurately.

FIG. 8 is a graph showing a case wherein the final target dose FinalDose cannot be determined accurately. Assume that the correction coefficient obtained by exposure of the (N−2)th shot region is Coef1(N−2), and the (N−1)th shot region is a defective shot region. When the actual dose for the (N−1)th shot region is lower than the final target dose for the (N−1)th shot region, the final target dose for the Nth shot region is calculated in consideration of the correction coefficient Coef1(N−1). Hence, the Nth shot region is overexposed. Similarly, the final target dose for the (N+1)th shot region is calculated in consideration of the correction coefficient Coef1(N). Hence, the (N+1)th shot region is underexposed. The actual dose gradually stabilizes. However, as is apparent, the defective shot region ((N−1)th shot region) adversely affects the full shot regions (Nth shot region and subsequent shot regions). If the correction coefficient Coef1(N−1) is not used, the adverse effect can be eliminated.

In step S308, the controller 13 calculates the speed (in this example, rotational speed) of the shutter 4 based on the final target dose (FinalDose). The rotational speed of the shutter 4 can be obtained by referring to the approximate function or data table, which is stored in the memory and represents the relationship between the target dose and the rotational speed of the shutter 4, as described with reference to FIG. 3. In the example shown in FIG. 3, when the final target dose is D1, the corresponding rotational speed of the shutter 4 is R1.

In step S309, the controller 13 sends a shutter rotation instruction to the shutter driving circuit 14 to rotate the shutter 4 at the rotational speed obtained in step S308, thereby rotating the shutter 4.

In step S310, the shutter 4 opens, and illumination light generated by the light source 1 illuminates the reticle 2, thereby starting exposing the substrate 3 to radiant energy. The amplifier 7 converts a signal indicating a light intensity output from the photosensor 5 into a voltage signal. The V/F converter 9 converts the voltage signal into a pulse train. The pulse counter 11 counts the number of pulses of the pulse train.

In step S311, based on the shutter rotational speed, the controller 13 waits for the timing when the shutter 4 is completely closed. In step S312, the controller 13 finishes the count operation of the pulse counter 11. In the second mode (low dose mode), the operation of the shutter 4 for dose control of the Nth shot region does not depend on the output of the dose sensor S (or count operation) during exposure of the Nth shot region.

In step S313, the controller 13 calculates an actual dose (MeasureResult) based on the number of pulses counted in steps S310 to S312. In step S313, the controller 13 calculates the correction coefficient (Coef1(N)) based on the actual dose (MeasureResult) and final target dose (TargetDose) in accordance with $$\text{Coef1(N)}=1/\{\text{MeasureResult/TargetDose}\} \tag{3}$$

The obtained correction coefficient (Coef1(N)) is used to calculate the final dose (FinalDose) of the next shot, that is, the (N+1)th shot.

In step S314, the controller 13 stores, in the memory as Coef1(N), the value calculated in step S313 in association with the shot number (N).

In step S315, the controller 13 determines whether exposure is executed for all shot regions. If exposure is not executed for all shot regions, the shot number (N) is incremented by 1, and the process returns to step S303.

In the above-described example, the final target dose is calculated based on the information about the area, the information about the substrate reflectance, and the information about the reflectance of the outer portion of the substrate. Alternatively, the final target dose is calculated based on the information about the area, the information about the substrate reflectance, the information about the reflectance of the outer portion of the substrate, and the correction information obtained by exposure of an already exposed shot region. However, the final target dose may be calculated based on at least one of the information about the area, the information about the substrate reflectance, and the information about the reflectance of the outer portion of the substrate. Alternatively, the final target dose may be calculated based on at least one of the information about the area, the information about the substrate reflectance, and the information about the reflectance of the outer portion of the substrate, and the correction information obtained by exposure of an already exposed shot region.

In the above-described example, the final target dose for the Nth shot region of the exposure target is calculated based on the correction coefficient obtained by exposure of the already exposed (N−1)th shot region. Instead, the final target dose for the Nth shot region may be calculated based on, for example, a correction coefficient obtained by exposure of a shot region near the Nth shot region.

The method of controlling the dose (exposure time) by using the correction coefficient obtained by exposure of the immediately preceding shot region is advantageous for correction of the driving error component of the shutter 4. On the other hand, the method of controlling the dose (exposure time) by using the correction coefficient obtained by exposure of a shot region in the vicinity is advantageous for correction of an error component generated due to the substrate state or process.

The shutter can employ various arrangements. For example, a shutter unit having a shutter to control the start of exposure and a shutter to control the end of exposure is preferably used, in addition to the rotary shutter described above.

As described above, according to this embodiment, the final target dose is determined based on information having a correlation with the intensity of light reflected from the holder and the substrate held by the holder. Based on the final target dose, the operation (open and close) of the shutter is controlled. It is therefore possible to accurately control the dose without reducing the light intensity even when a substrate is exposed to radiant energy at a low dose without using a dose sensor. Hence, accurate dose control at a high throughput can be realized.

In the above embodiment, in the second mode (low dose mode), the final target dose is determined based on information having a correlation with the intensity of light reflected from the holder 22 and the substrate held by the holder 22. However, this dose control may also be applied in exposure at a high dose in which the dose can accurately be controlled even when the shutter is closed in accordance with the output from the dose sensor.

Figure 9:
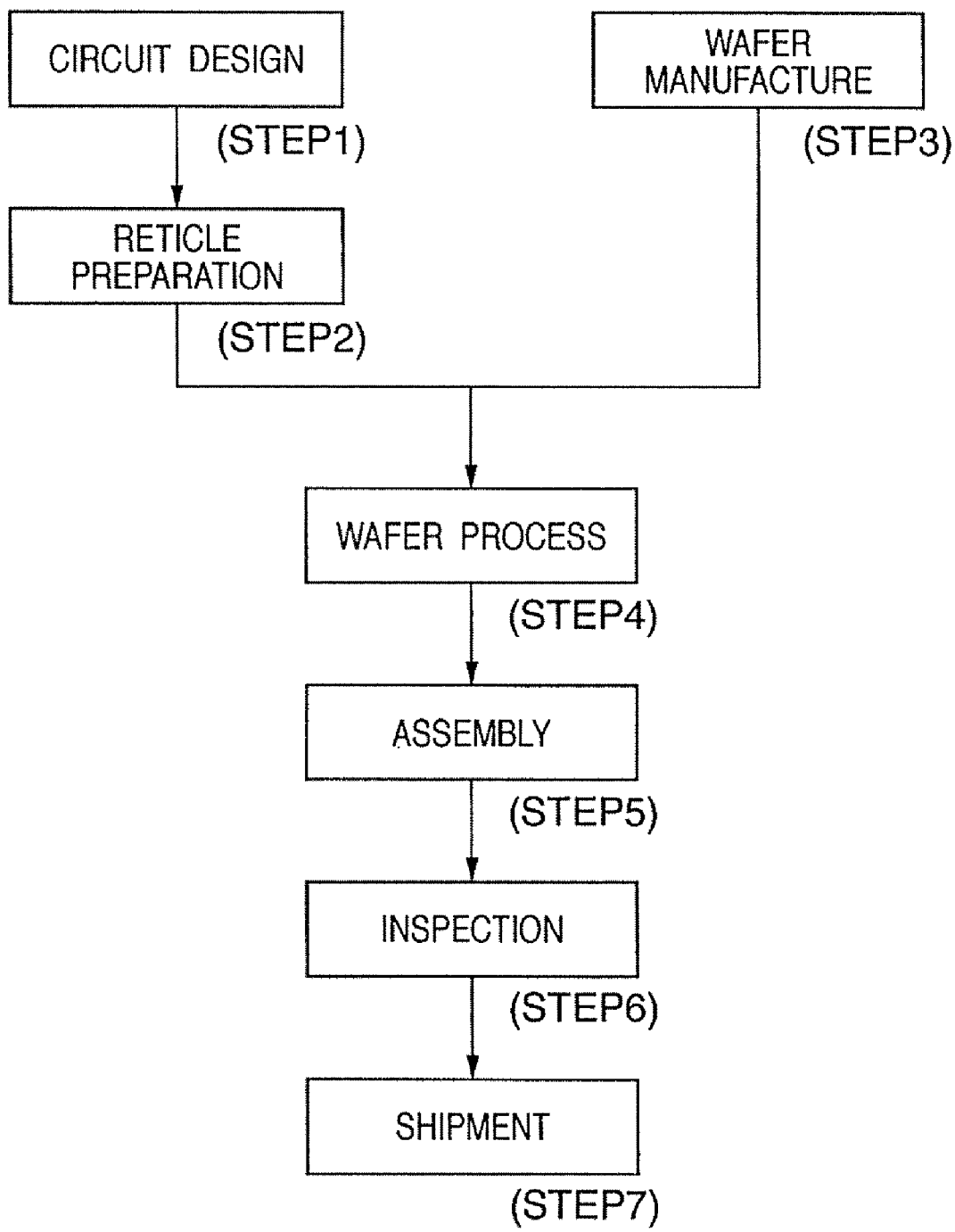
FIG. 9 is a flowchart illustrating the overall sequence of a semiconductor device manufacturing process.

A device manufacturing method using the above-described exposure apparatus will be described next. FIG. 9 is a flowchart illustrating the overall sequence of a semiconductor device manufacturing process. In step 1 (circuit design), the circuit of a semiconductor device is designed. In step 2 (reticle preparation), a reticle (also called an original plate or mask) is prepared based on the designed circuit pattern. In step 3 (wafer manufacture), a wafer (also called a substrate) is manufactured using a material such as silicon. In step 4 (wafer process) called a preprocess, an actual circuit is formed on the wafer by lithography using the reticle and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and shipped (step 7).

FIG. 10 illustrates a detail sequence of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (CMP), the insulating film is planarized by CMP. In step 16 (resist process), a photosensitizer is applied to the wafer. In step 17 (exposure), a latent image pattern is formed on the resist by exposing the wafer with the photosensitizer to radiant energy through the mask having the circuit pattern by using the above-described exposure apparatus. In step 18 (development), the latent image pattern formed on the resist on the wafer is developed to form a resist pattern. In step 19 (etching), a layer or substrate under the resist pattern is etched through an opening in the resist pattern. In step 20 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-339204, filed Dec. 15, 2006, which is hereby incorporated by reference herein in its entirety.

What is claimed is:

1. An exposure apparatus for exposing a substrate to light, the apparatus comprising:
   a holder configured to hold the substrate;
   a shutter for regulating exposure time for the substrate; and
   a controller configured to control an operation of the shutter, wherein the controller is configured to obtain information having a correlation with intensity of light reflected from a portion of the holder and the substrate held by the holder, wherein the portion of the holder is irradiated with light when a defective shot region is exposed to light, calculate a target dose based on the information for each shot region, and control the operation of the shutter based on each target dose for each shot region.

2. An apparatus according to claim 1, wherein the information having the correlation with the intensity of the reflected light includes at least one of information about an area of a shot region on the substrate, information about a reflectance of the substrate, and information about a reflectance of the portion for each shot region.

3. An apparatus according to claim 1, wherein the controller is configured to control the operation of the shutter further based on a dose for an already exposed shot region.

4. An apparatus according to claim 3, wherein the controller is configured to control a speed of the shutter.

5. An apparatus according to claim 1, further comprising a sensor configured to detect a dose for the substrate,
wherein the controller is configured to control a timing of closing the shutter based on an output from the sensor in a first mode, and to control a speed of the shutter based on the information having the correlation with the intensity of the reflected light in a second mode.

6. An apparatus according to claim 1, wherein the controller is configured to control a speed of the shutter based on the target dose.

7. A method of manufacturing a device, said method comprising:
exposing a substrate to light using an exposure apparatus;
developing the exposed substrate; and
processing the developed substrate to manufacture the device;
wherein the exposure apparatus includes a holder configured to hold the substrate, a shutter for regulating exposure time for the substrate, and a controller configured to control an operation of the shutter, and
wherein the controller is configured to obtain information having a correlation with intensity of light reflected from a portion of the holder and the substrate held by the holder, wherein the portion of the holder is irradiated with light when a defective shot region is exposed to light, calculate a target dose based on the information for each shot region, and control the operation of the shutter based on each target dose for each shot region.

8. An exposure apparatus for exposing a substrate to light, the apparatus comprising:
a holder configured to hold the substrate;
a shutter for regulating exposure time for the substrate; and
a controller configured to control an operation of the shutter,
wherein the controller is configured to obtain information about a reflectance of the substrate held by the holder, information about a ratio of an area of a defective shot region within the substrate to an area of a full shot region and information about a reflectance of the holder, calculate a target dose based on the information for each defective shot region, and control the operation of the shutter based on each target dose, in exposing each defective shot region of the substrate.

9. An exposure apparatus for exposing a substrate to light, the apparatus comprising:
a holder configured to hold the substrate;
a shutter for regulating exposure time for the substrate;
an input device configured to input information having a correlation with intensity of light reflected from a portion of the holder and the substrate held by the holder for each shot region, wherein the portion of the holder is irradiated with light when a defective shot region is exposed to light, and
a controller configured to control an operation of the shutter based on the information for each shot region.

10. An exposure apparatus for exposing a substrate to light, the apparatus comprising:
a holder configured to hold the substrate;
a shutter for regulating exposure time for the substrate;
a sensor configured to detect a dose for the substrate; and
a controller configured to control an operation of the shutter,
wherein the controller is configured to control the operation of the shutter for each shot region based on a target dose obtained from information having a correlation with intensity of light reflected from a portion of the holder and the substrate held by the holder for each shot region and a correction coefficient which is correction information obtained based on the actual dose measured by the sensor and the target dose in exposure of the immediately preceding shot region for each shot region, wherein the portion of the holder is an outer portion of the substrate holder, which is irradiated with light when a defective shot region is exposed to light.

* * * * *